(12) United States Patent
Morimoto et al.

(10) Patent No.: US 6,621,347 B2
(45) Date of Patent: Sep. 16, 2003

(54) RF POWER AMPLIFIER

(75) Inventors: Shigeru Morimoto, Moriguchi (JP);
Hidetoshi Ishida, Kyoto (JP);
Motonari Katsuno, Takatsuki (JP);
Masahiro Maeda, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/017,391

(22) Filed: Dec. 18, 2001

(65) Prior Publication Data

US 2002/0079970 A1 Jun. 27, 2002

(30) Foreign Application Priority Data

Dec. 21, 2000 (JP) ........................................ 2000-388544

(51) Int. Cl.⁷ ............................... H03F 3/68; H03F 3/60
(52) U.S. Cl. ...................... 330/295; 330/307; 330/286
(58) Field of Search ............................. 330/53, 54, 55, 330/124 R, 286, 295, 307

(56) References Cited

U.S. PATENT DOCUMENTS 5,274,341 A    12/1993  Sekine et al.
6,201,445 B1 *  3/2001  Morimoto et al. .......... 330/295

FOREIGN PATENT DOCUMENTS

JP    11-251849    9/1999

* cited by examiner

Primary Examiner—Steven J. Mottola
(74) Attorney, Agent, or Firm—Nixon Peabody LLP; Thomas W. Cole

(57) ABSTRACT

An RF power amplifier has a pair of power amplifying elements for receiving first and second distributed signals resulting from distribution of an input signal from the outside and having the characteristics of the same amplitude and opposite phases, performing power amplification with respect to each of the first and second distributed signals that have been received, and outputting the first and second amplified signals and a pair of transmission lines connected correspondingly to the pair of power amplifying elements. The pair of transmission lines have a pair of protruding portions provided at respective edge portions thereof disposed in opposing relation. The pair of protruding portions are disposed in mutually spaced apart and opposing relation to compose a capacitor.

4 Claims, 5 Drawing Sheets

RF POWER AMPLIFIER

BACKGROUND OF THE INVENTION

The present invention relates to high-output RF power amplifiers and, more particularly, to a push-pull RF power amplifier.

An RF power amplifier for data transmission used in radio communication equipment represented by a mobile phone has been required to be smaller in size and perform a high-output and high-efficiency operation. As an example of means for increasing the output of the power amplifier, there has been known a push-pull power amplifier circuit which operates power amplifying elements composed of a pair of field-effect transistors (TFTs) in phase opposition, combines output signals from the individual FETs, and outputs a resultant signal.

CONVENTIONAL EMBODIMENT 1

A description will be given herein below to an RF power amplifier according to a first conventional embodiment disclosed in Japanese Unexamined Patent Publication No. HEI 11-251849 with reference to the drawings.

FIG. 4 shows a circuit structure of the push-pull RF power amplifier according to the first conventional embodiment disclosed in the foregoing publication.

As shown in FIG. 4, the RF power amplifier comprises: a power distributing circuit 102 for distributing a signal inputted to an input terminal 101 such that first and second distributed signals having the same amplitude and a phase difference of 180° therebetween are outputted therefrom; an amplifier main body portion 103 composed of a pair of FET elements 103a which have a common source and respective gates for receiving the first and second distributed signals, perform power amplification with respect to the first and second distributed signals, and output first and second amplified signals; and a power combining circuit 105 which receives the first and second amplified signals, combines the first and second amplified signals that have been received, and outputs a resultant signal to an output terminal 104.

Between the power distributing circuit 102 and the amplifier main body portion 103, there is provided an input matching circuit 107 for matching the impedance of an input-side device connected to the input terminal 101 and the input impedance of the amplifier main body portion 103 via a pair of input capacitors 106 for interrupting a dc signal which are provided on the input side.

Between the amplifier main body portion 103 and the power combining circuit 105, there is provided an output matching circuit 109 for matching the output impedance of the amplifier main body portion 103 and the impedance of an output-side device connected to the output terminal 104 via a pair of output capacitors 108 for interrupting a dc signal which are provided on the output side.

The input matching circuit 107 is composed of: a pair of microstrip lines 107a connecting each of the input capacitors 106 to the amplifier main body portion 103 in series; and an input matching capacitor 107b for connecting the pair of microstrip lines 107a to each other. Likewise, the output matching circuit 109 is composed of: a pair of microstrip lines 109a for connecting the amplifier main body portion 103 to each of the output capacitors 108 in series; and an output matching capacitor 109b for connecting the pair of microstrip lines 109a to each other.

Gate bias terminals 110 to each of which a gate bias signal is applied are connected to the respective gates of the FET elements 103a of the amplifier main body portion 103 via respective lines 111. The gate bias terminals 110 are grounded via respective capacitors 112.

Likewise, drain bias terminals 113 to each of which a drain bias signal is applied are connected to the respective drains of the FET elements 103a of the amplifier main body portion 103 via respective lines 114. The drain bias terminals 113 are grounded via respective capacitors 115.

CONVENTIONAL EMBODIMENT 2

A description will be given next to a push-pull RW power amplifier according to a second conventional embodiment with reference to the drawings.

FIG. 5 shows the amplifier main body portion 103 formed on a package 201 prior to sealing. The second conventional embodiment is different from the first conventional embodiment in that the amplifier main body portion 103 is provided with a first tertiary harmonic control circuit 211 and a second tertiary harmonic control circuit 212.

As shown in FIG. 5, the package 201 is provided with: the pair of FET elements 103a; a pair of input terminals 202 for receiving the first and second distributed signals from the power distributing circuit 107 shown in FIG. 4; and a pair of output terminals 203 for outputting the first and second amplified signals. Between the input terminals 202 and the FET elements 103a, there are provided a pair of input terminal electrodes 205 and a pair of internal input matching transmission lines 206 which are electrically connected to each other via bonding wires 204. Likewise, a pair of internal output matching transmission lines 207 and a pair of output terminal electrodes 208 which are electrically connected to each other via bonding wires 204 are provided between the FET elements 103a and the output terminals 203.

A first high dielectric substrate 209 is provided under each of the internal input matching transmission lines 206, while a second high dielectric substrate 210 is provided under each of the internal output matching transmission lines 207.

Each of the internal input matching transmission lines 206 on the first high dielectric substrate 209 is connected to the first tertiary harmonic control circuit 211. The first tertiary harmonic control circuit 211 is constituted by: a pair of microstrip lines 211a having respective one ends connected individually to the internal input matching transmission lines 206; and a chip capacitor 211b interposed between and connected to the respective other ends of the pair of microstrip lines 211a. Each of the microstrip lines 211a has a length corresponding to $1/12$ of the fundamental wavelength $\lambda$ of an input signal.

Likewise, each of the internal output matching transmission lines 207 on the second high dielectric substrate 210 is connected to the second tertiary harmonic control circuit 212. The second tertiary harmonic control circuit 212 is constituted by: a pair of microstrip lines 212a having respective one ends connected individually to the internal output matching transmission lines 207 and a chip capacitor 212b interposed between and connected to the respective other ends of the pair of microstrip lines 212a. Each of the microstrip lines 212a also has a length corresponding to $1/12$ of the fundamental wavelength $\lambda$ of an input signal.

A description will be given herein below to the characteristics of the RF power amplifier circuit according to the second conventional embodiment.

To obtain a high output from each of the FET elements, it is normally required to increase the gate width of the FET element. The increased gate width reduces each of the input/output impedances of the FET element so that the impedance ratio between the FET element and an external matching circuit is increased. As a result, a loss in converting the impedance of the matching circuit is increased disadvantageously.

To prevent the increased loss, the RF amplifier according to the conventional embodiment has the first and second high dielectric substrates 209 and 210 provided in proximity to the input/output terminals 202 and 203 of each of the FET elements 103a, respectively, thereby accomplishing conversion such that the impedance is maximized in the vicinity of the FET element 103a and suppressing a loss in impedance conversion resulting from the matching circuit provided externally. Such a circuit is termed an internal matching circuit because it is provided within the package 201.

As is well known, the first and second distributed signals inputted to each of the FET elements 103a are amplified and outputted. If the inputted signals have large amplitudes, however, the FET element 103a generates not only a fundamental wave but also a harmonic. In addition, the first and second distributed signals have a phase difference of 180° therebetween. If comparisons are made between signals at the respective input terminals 202 of the FET elements 103a and between signals at the respective output terminals 203 of the FET elements 103a, each of the fundamental wave and an odd harmonic has a phase difference of 180°, while an even harmonic has a phase difference of 0°.

In the second conventional embodiment, the first tertiary harmonic control circuit 211 provided on the input side keeps a load impedance to an odd harmonic at the input terminal 202 at a high value close to the impedance of an open circuit so that each of the FET elements 103a performs F-class operation and a power added efficiency (drain efficiency) is improved.

Likewise, the second tertiary harmonic control circuit 212 provided on the output side keeps a load impedance to an odd harmonic at the output terminal 203 at a high value close to the impedance of an open circuit so that each of the FET elements 103a performs F-class operation and the power added efficiency is improved.

If the gate width of each of the FET elements 103a is increased such that a high output is obtained from the RF power amplifier, the input/output impedances of the FET element 103a are reduced. Consequently, each of the high dielectric substrates 209 and 210 used for the internal matching circuit is required to function as a capacitor with a large capacitance. The capacitance value of the capacitor composed of the high dielectric substrate 209 or 210 is determined by the dielectric constant and thickness of the substrate. Since the dielectric constant is determined by a material, fine adjustment of the capacitance value is performed by adjusting the thickness.

To implement capacitors with large capacitances in the RF power amplifiers according to the first and second conventional embodiments, the thickness of each of the first and second high dielectric substrates 209 and 210 should be reduced so that the substrates are easily broken during mounting in the fabrication process. Another problem is encountered in a back-surface polishing step performed to adjust the thickness of each of the high dielectric substrates 209 and 210. Every time the back-surface polishing step is performed, variations of normally about 10% occur in the thicknesses of the substrates 209 and 210 so that variations also occur in the capacitance values of the capacitors.

Still another problem is encountered in forming the tertiary harmonic control circuits 211 and 212 on the first and second high dielectric substrates 209 and 210, respectively, for higher-efficiency operation. Although the chip capacitors 211b and 212b are used as respective capacitors necessary for the tertiary harmonic control circuits 211 and 212, variations occur in the capacitance values of the chip capacitors. In addition, an extra step of mounting the chip capacitors 211b on the respective high dielectric substrates 209 and 210 should also be performed.

SUMMARY OF THE INVENTION

It is therefore a first object of the present invention to allow an easy increase in the capacitance of a capacitor in the internal matching circuit of an RF power amplifier by solving the foregoing conventional problems. A second object of the present invention is to prevent variations in the capacitance of a capacitor in a tertiary harmonic control circuit and obviates the necessity for a mounting step.

To attain the first object, the present invention in one aspect is constructed such that a pair of protruding portions are disposed in mutually spaced apart and opposing relation to produce a capacitance component on a pair of transmission lines corresponding to input and output signals to and from a pair of power amplifying elements performing a push-pull operation.

To attain the second object, the present invention in another aspect is constructed such that a capacitor connected to transmission lines each corresponding to $\frac{1}{12}$ of a fundamental wavelength is formed from a space between the protruding portions of the transmission lines.

Specifically, an RF power amplifier according to the present invention comprises: a pair of power amplifying elements for receiving first and second distributed signals resulting from distribution of an input signal from the outside and having characteristics of the same amplitude and opposite phases, performing power amplification with respect to each of the first and second distributed signals that have been received, and outputting the first and second amplified signals; and a pair of transmission lines connected correspondingly to the pair of power amplifying elements, the pair of transmission lines having a pair of protruding portions provided at respective edge portions thereof disposed in opposing relation, the pair of protruding portions being disposed in mutually spaced apart and opposing relation to compose a capacitor.

In the RF power amplifier according to the present invention, the opposing edge portions of the pair of transmission lines are provided with the pair of protruding portions opposed to each other with the space provided therebetween such that the capacitor for performing impedance conversion with respect to the pair of power amplifying elements is composed of the protruding portions. By adjusting the space between the protruding portions, therefore, a high-precision capacitor with a large capacitance can be implemented.

Since the pair of protruding portions allow the adjustment of the capacitance value of the capacitor and the position thereof on a substrate, higher-precision impedance matching can be performed with respect to the pair of power amplifying elements.

Preferably, the RF power amplifier according to the present invention further comprises: a capacitance adjusting film composed of a high dielectric material and provided indiscretely over the pair of protruding portions. The arrangement implements a high-precision capacitor with a large capacitance by adjusting the dielectric constant and thickness of the capacitance adjusting film and the position at which it is formed.

In the RF power amplifier according to the present invention, each of the pair of protruding portions preferably has a line length corresponding to about 1/12 of a fundamental wavelength of the input signal.

In the arrangement, the capacitor composed of the pair of protruding portions constitutes a tertiary harmonic control circuit. By adjusting the space between the protruding portions or the width of each of the protruding portions, therefore, a high-precision capacitor with an optimum capacitance value can be formed easily. This eliminates variations in the capacitance value of the capacitor and obviates the necessity for a chip capacitor so that the step of mounting the chip capacitor is omitted.

In the RF power amplifier according to the present invention, the pair of transmission lines are preferably formed on respective substrates each composed of a high dielectric material. The arrangement reduces the lengths of the transmission lines and reduces the size of the amplifier.

DETAILED DESCRIPTION OF THE INVENTION

Figure 1:
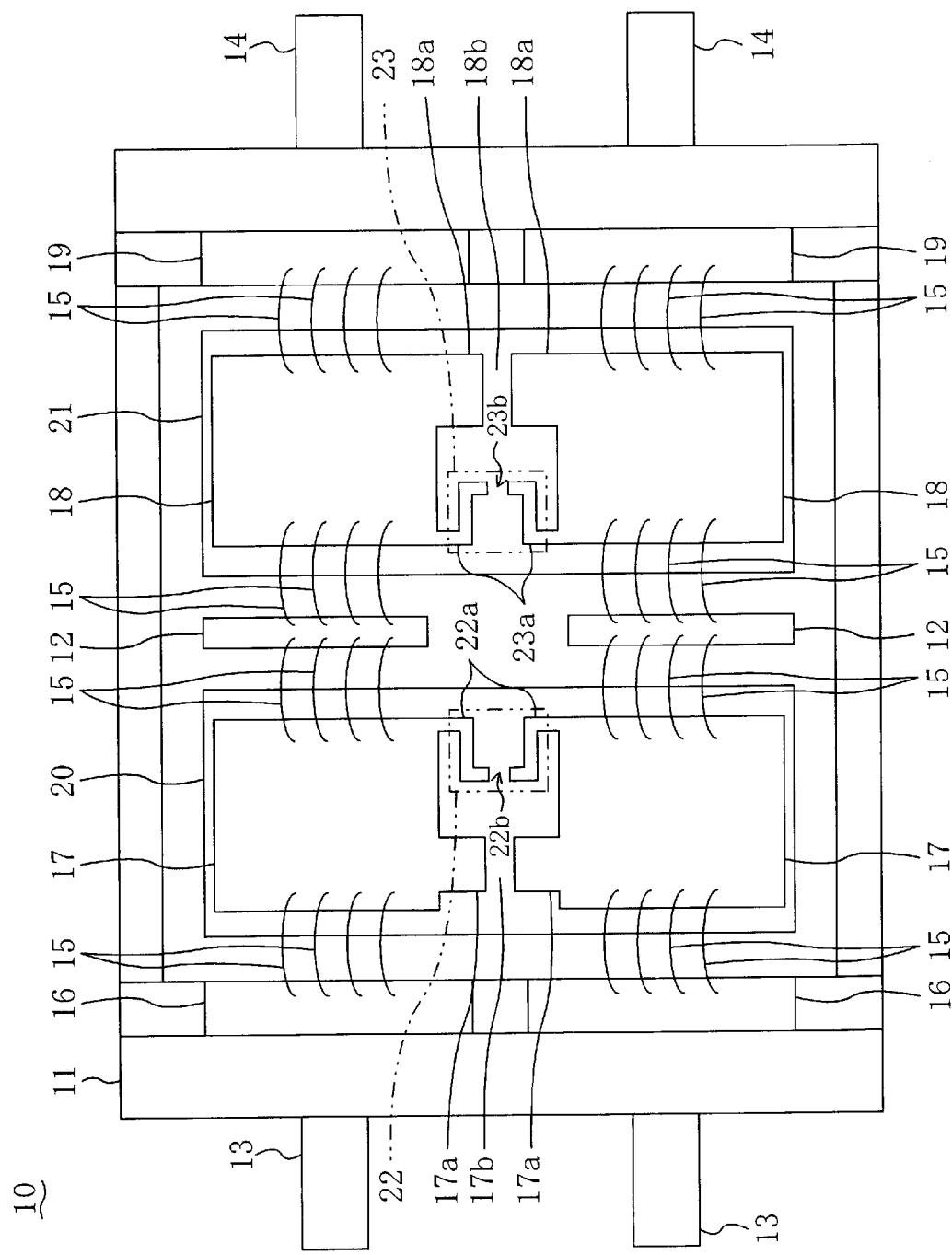
FIG. 1 is a plan view of an amplifier main body portion of an RF power amplifier according to an embodiment of the present invention.

Referring now to the drawings, an embodiment of the present invention will be described.

FIG. 1 shows a plan structure of an amplifier main body portion of an RF power amplifier according to the embodiment of the present invention. The amplifier main body portion 10 shown in FIG. 1 is formed on a package 11.

As shown in FIG. 1, the package 11 is provided with: a pair of FET elements as power amplifying elements; a pair of input terminals 13 for receiving first and second distributed signals from a power distributing circuit, which will be described later; and a pair of output terminals 14 for outputting first and second amplified signals.

Between the input terminals 13 and the FET elements 12, there are provided a pair of input terminal electrodes 16 and a pair of internal input matching transmission lines 17 which are electrically connected to each other via a plurality of bonding wires 15.

Likewise, a pair of internal output matching transmission lines 18 and a pair of output terminal electrodes 19 which are electrically connected to each other via a plurality of bonding wires 15 are provided between the FET elements 12 and the output terminals 14.

The internal input matching transmission lines 17 and the internal output matching transmission lines 18 are formed on the first and second high dielectric substrates 20 and 21, respectively, which are provided on the package 11. The arrangement allows the first and second high dielectric substrates 20 and 21 to function as capacitor with large capacitances relative to the ground provided on the respective surfaces (back surfaces) of the substrates 20 and 21 opposite to the transmission lines 17 and 18.

The present embodiment is characterized in that a pair of protruding portions 17a each composed of a conductive material are provided on the region of the first high dielectric substrate 20 located between the internal input matching transmission lines 17 and closer to the input terminal electrodes 16 such that a space (gap) 17b is formed between the opposing edge portions of the pair of internal input matching transmission lines 17.

On the region of the first high dielectric substrate 20 located between the internal input matching transmission lines 17 and closer to the FET element 12, a first tertiary harmonic control circuit 22 is provided. The first tertiary harmonic control circuit 22 is constituted by: a pair of microstrip lines 22a having respective one ends connected to the internal input matching transmission lines 17 and a line width corresponding to 1/12 of the fundamental wavelength λ of an input signal; and a capacitor 22b composed of the respective other ends of the pair of microstrip lines 22a disposed in spaced apart and opposing relation.

Similarly to the input side, a pair of protruding portions 18a each composed of a conductive material are provided on the region of the second high dielectric substrate 21 located between the internal output matching transmission lines 18 and closer to the output terminal electrode 19 such that a space (gap) 18b is formed between the opposing edge portions of the pair of internal output matching transmission lines 18.

A second tertiary harmonic control circuit 23 is provided on the region of the second high dielectric substrate 21 located between the internal output matching transmission lines 18 and closer to the FET element 12. The second tertiary harmonic control circuit 23 is constituted by: a pair of microstrip lines 23a having respective one ends connected to the internal output matching transmission lines 18 and a line length corresponding to 1/12 of the fundamental wavelength λ of an input signal; and a capacitor 23b composed of the respective other ends of the pair of microstrip lines 23a disposed in spaced apart and opposing relation.

Thus, the first and second tertiary harmonic control circuits 22 and 23 are formed on the first and second high dielectric substrates 20 and 21 each composed of a high dielectric material, respectively, so that the wavelength of a propagating signal is substantially reduced and therefore the length of each of the microstrip lines 22a is reduced. This allows the scaling down of the first and second tertiary harmonic control circuits 22 and 23.

Since the first and second tertiary harmonic control circuits 22 and 23 are positioned adjacent each of the FET elements 12, a tertiary harmonic can be controlled more positively.

Figure 2:
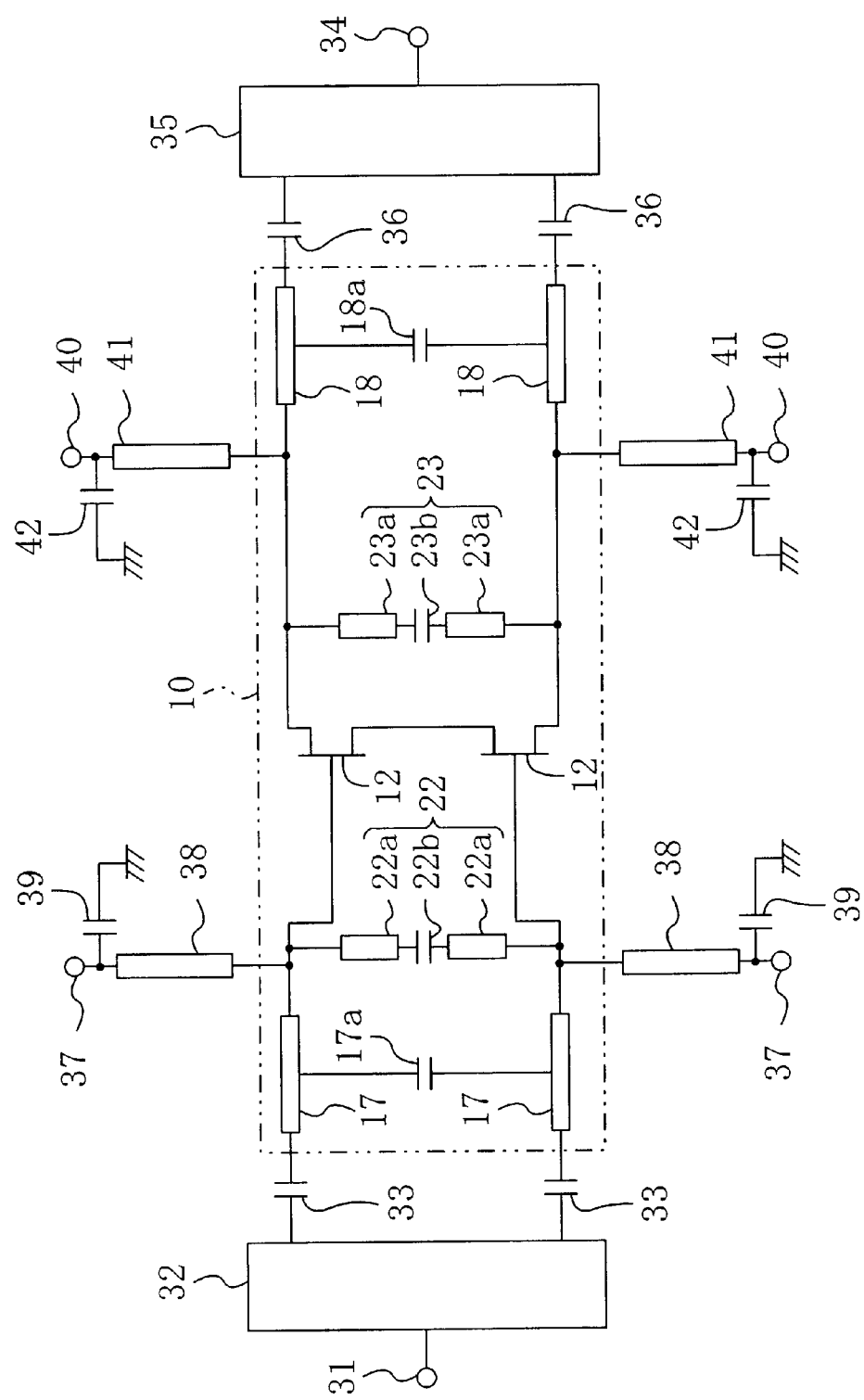
FIG. 2 is a circuit diagram of the RF power amplifier according to the embodiment of the present invention.

FIG. 2 shows a circuit structure of the RF power amplifier according to the embodiment of the present invention. In FIG. 2, the same components as shown in FIG. 1 are designated at the same reference numerals.

In the stage previous to the amplifier main body portion 10 of the RF power amplifier, a power distributing circuit 32 for distributing a signal inputted to an input terminal 31 such that first and second distributed signals having the same amplitude and a phase difference of 180° therebetween are outputted therefrom is connected via a pair of input capacitors 33 for interrupting a dc signal, as shown in FIG. 2. In the stage subsequent to the amplifier main body portion 10, a power combining circuit 35 which receives first and second amplified signals, combines the first and second amplified signals that have been received, and outputs a resultant signal to an output terminal 34 is connected via a pair of output capacitors 36 for interrupting a dc signal.

Gate bias terminals 37 to each of which a gate bias signal is applied are connected to the respective gates of the FET elements 12 of the amplifier main body portion 10 via respective lines 38. The gate bias terminals 37 are grounded via respective capacitors 39.

Likewise, drain bias terminals 40 to each of which a drain bias signal is applied are connected to the respective drains of the FET elements 12 of the amplifier main body portion 10 via respective lines 41. The drain bias terminals 40 are grounded via respective capacitors 42.

A description will be given herein below to the operation of the RF power amplifier thus constructed.

The first and second distributed signals having the characteristics of the same amplitude and opposite phases and generated by the power distributing circuit 32 are inputted to the pair of input terminals 13 of the package 11. The inputted distributed signals are inputted individually to the pair of FET chips 12 via the pair of input terminal electrodes 16 and to the internal input matching transmission lines 17 on the first high dielectric substrate 20.

Since the first and second distributed signals have opposite phases on the pair of internal input matching transmission lines 17, one of the internal input matching transmission lines 17 has a capacitance component resulting from the space 17b relative to the other of the internal input matching transmission lines 17. In other words, a capacitor composed of the pair of protruding portions 17a provided on the first high dielectric substrate 20 in mutually spaced apart and opposing relation provides a capacitance value larger than a capacitance value obtained relative to the ground on the back surface.

Through fine adjustment of impedance by adjusting (increasing or reducing) the size of the space 17b between the protruding portions 17a or by adjusting the size of each of the protruding portions 17a, an impedance value optimum to the input impedance of each of the FET elements 12 is obtainable.

If the FET elements 12 have variations in input/output impedance characteristics due to individual differences, the size of the space 17b may also be adjusted by performing trimming with respect to the protruding portions 17a using a laser beam or the like, while monitoring the impedance characteristic or RF characteristic in real time.

Thus, according to the present embodiment, the back-surface polishing step for adjusting the capacitance of the internal input matching transmission lines 17 can be omitted because the capacitor with a large capacitance required by the internal matching circuit is formed from the space between the internal input matching transmission lines 17.

In the first tertiary harmonic control circuit 22 formed on the first high dielectric substrate 20, the capacitance value of the capacitor 22b using the respective edge portions of the pair of microstrip lines 22a as the opposing electrodes has been adjusted such that the impedance characteristic of the input-side circuit to a tertiary harmonic frequency when viewed from each of the FET elements 12 is substantially that of an open circuit. This allows each of the FET elements 12 to perform F-class operation with high efficiency. By adjusting the size of the space between the respective edge portions of the pair of microstrip lines 22a and the width of each of the lines, the capacitance value of the capacitor 22b composed of the edge portions can be adjusted with higher precision and more flexibility than in the case of using a chip capacitor or the like. In addition, the step of mounting the chip capacitor can also be omitted.

The first and second signals amplified and outputted by the pair of FET chip elements 12 have the characteristics of the same amplitude and opposite phases and are applied to the pair of output terminals 14 via the internal output matching transmission lines 18 on the second high dielectric substrate 21 and via the pair of output terminal electrodes 19.

The second high dielectric substrate 21 functions as a capacitor with a large capacitance relative to the ground on the back surface thereof, similarly to the first high dielectric substrate 20 provided on the input side. Since the first and second amplified signals have opposite phases on the pair of internal output matching transmission lines 18 on the second high dielectric substrate 21, one of the internal output matching transmission lines 18 has a capacitance component resulting from the space 18b relative to the other of the internal output matching transmission lines 18. In other words, a capacitor composed of the pair of protruding portions 18a provided on the second high dielectric substrate 21 in mutually spaced apart and opposing relation provides a capacitance value larger than a capacitance value obtained relative to the ground on the back surface.

Through fine adjustment of impedance by adjusting (increasing or reducing) the size of the space 18b between the protruding portions 18a or by adjusting the size of each of the protruding portions 18b, an impedance value optimum to the output impedance of each of the FET elements 12 is obtainable.

In the second tertiary harmonic control circuit 23 formed on the second high dielectric substrate 21 also, the capacitance value of the capacitor 23b using the respective edge portions of the pair of microstrip lines 23a as the opposing electrodes has been adjusted such that the impedance characteristic of the output-side circuit to a tertiary harmonic frequency when viewed from the FET elements 12 is substantially that of an open circuit, similarly to the first tertiary harmonic control circuit 22 provided on the input side. This allows each of the FET elements 12 to perform F-class operation with high efficiency.

Then, the first and second amplified signals outputted from the pair of output terminals 14 and having the same amplitude and opposite phases are combined by the power combining circuit 35 and outputted therefrom.

Although the internal input matching transmission lines 17 and the internal output matching transmission lines 18 are provided with the respective protruding portions 17a and 18a, it is also possible to provide either the protruding portions 17a or the protruding portions 18a. The protruding portions 17a and 18a need not necessarily be provided at all.

Although the FET elements 12 have been used for the power amplifying elements, bipolar transistors may also be used instead of the FETs.

VARIATION OF EMBODIMENT

A variation of the embodiment of the present invention will be described with reference to the drawings.

Figure 3:
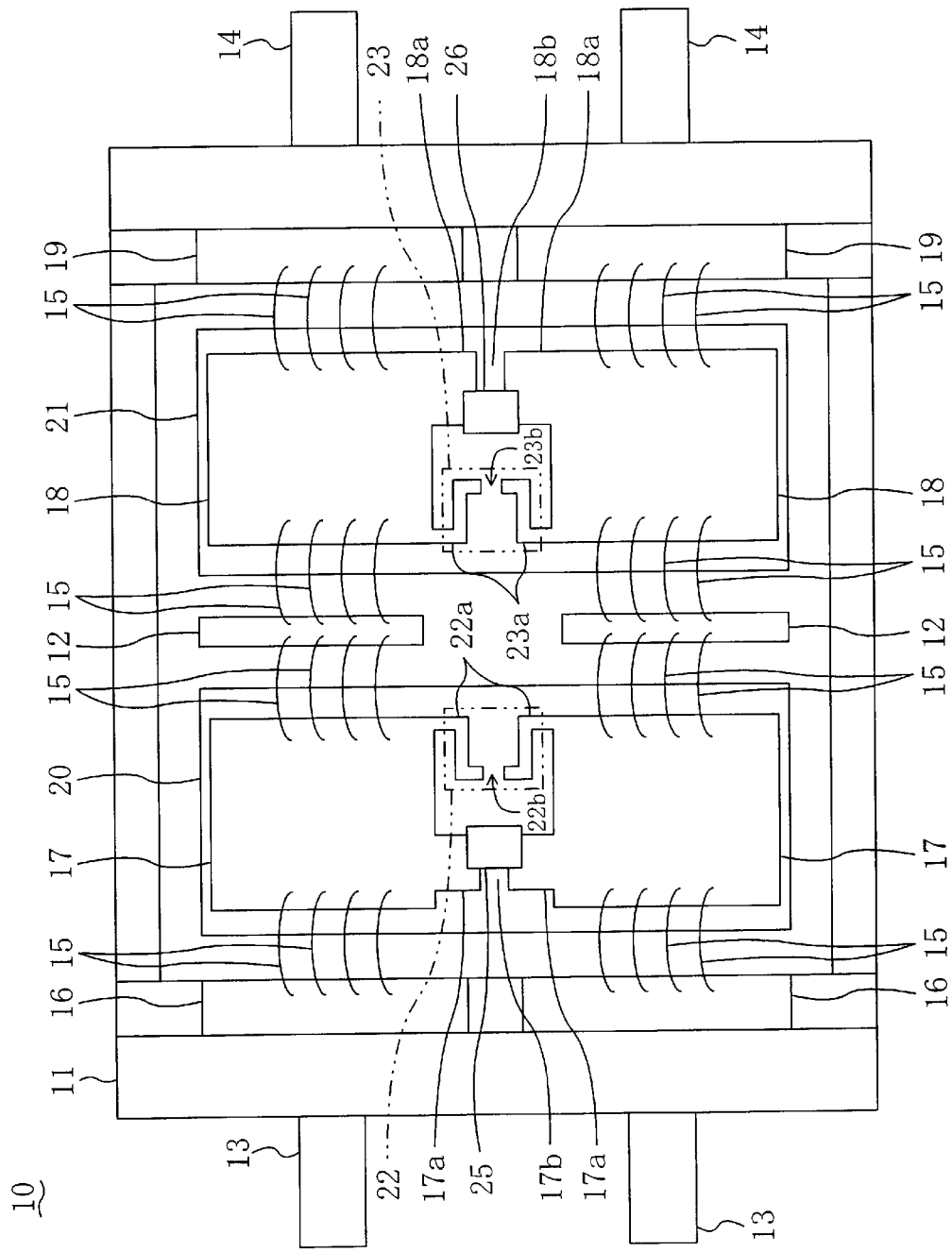
FIG. 3 is a plan view of an amplifier main body portion of an RF power amplifier according to a variation of the embodiment of the present invention.
Figure 4:
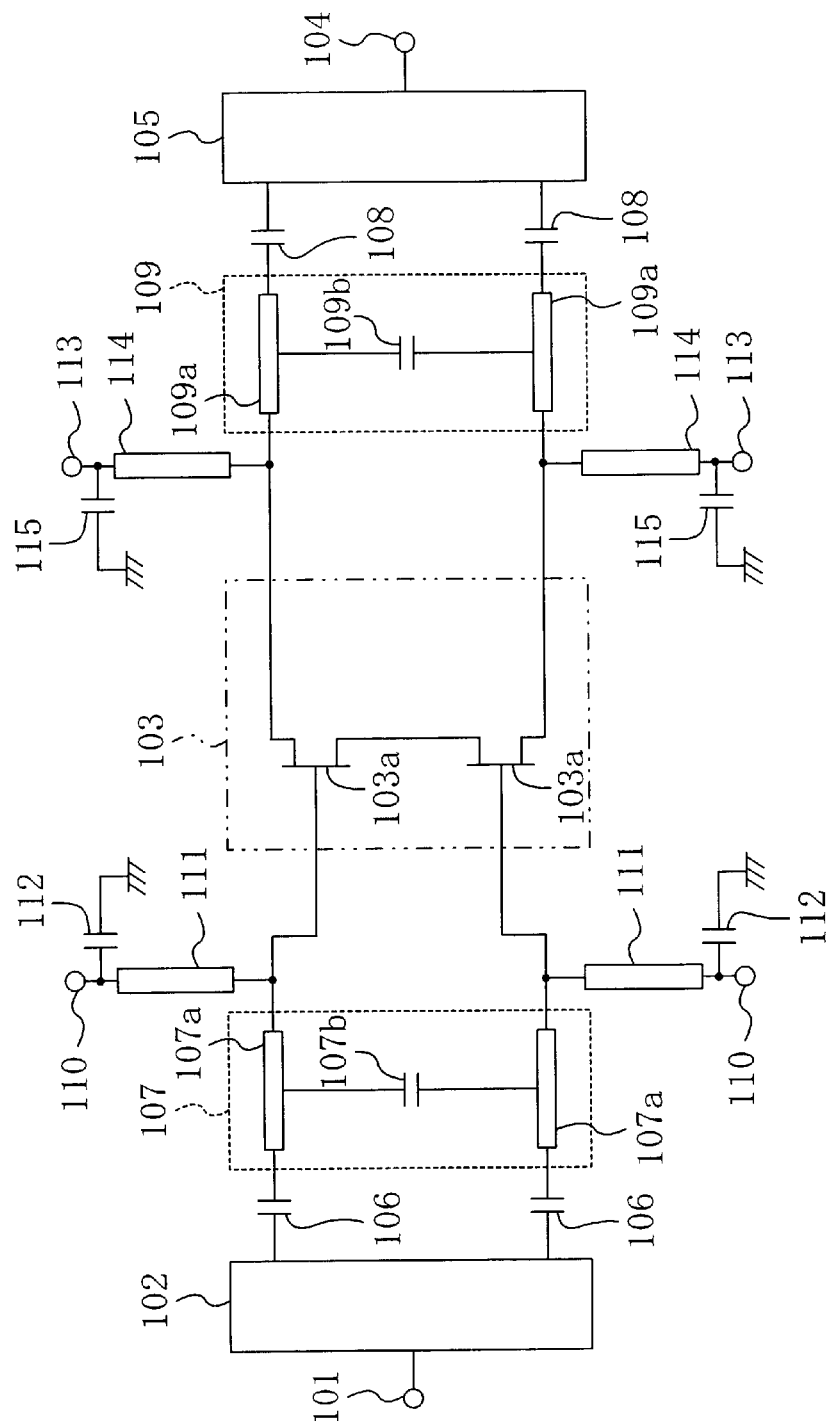
FIG. 4 is a circuit diagram of a push-pull RF power amplifier according to a first conventional embodiment.
Figure 5:
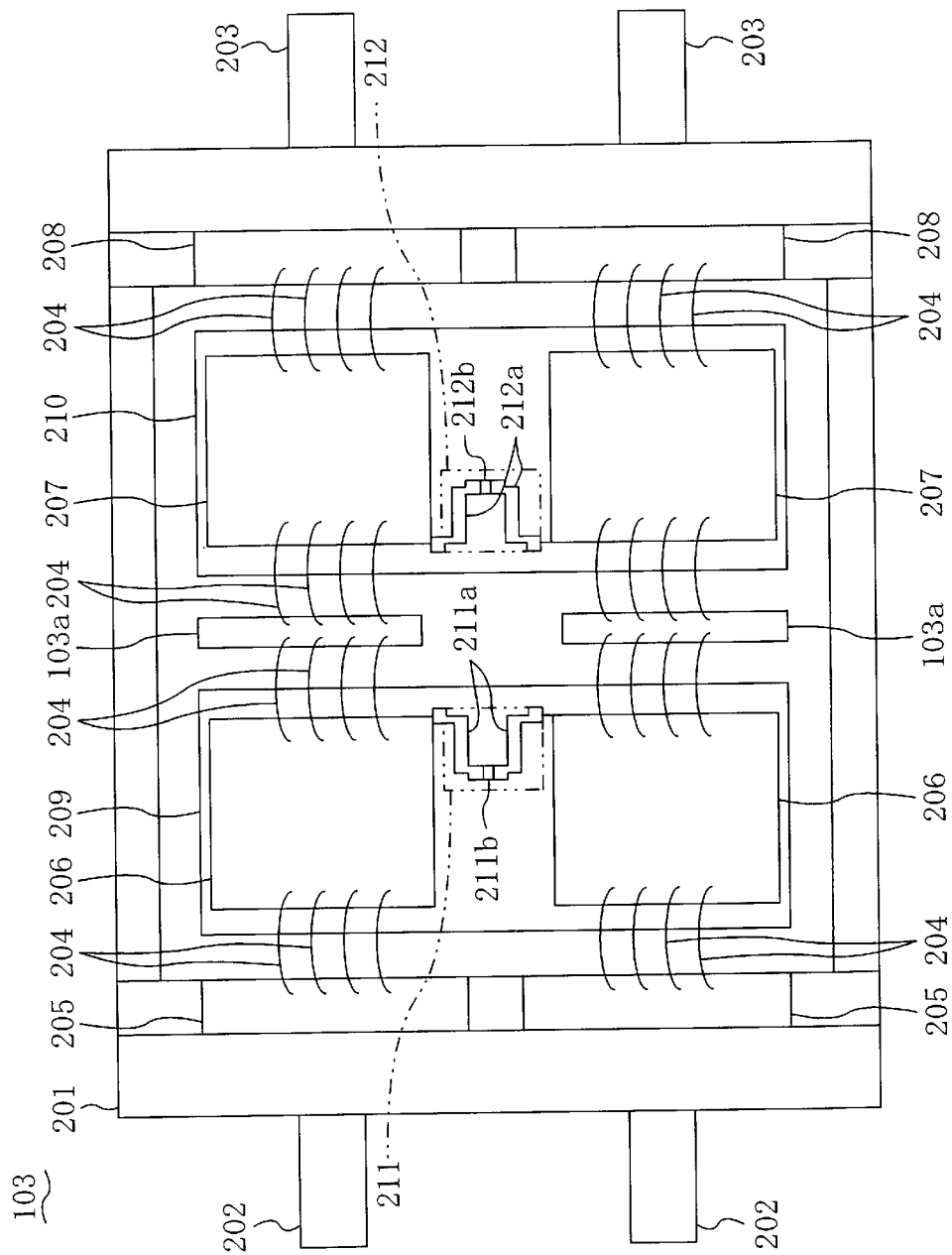
FIG. 5 is a plan view of a push-pull RF power amplifier according to a second conventional embodiment.

FIG. 3 shows a plan structure of an amplifier main body portion of an RF power amplifier according to the variation. The description of the components shown in FIG. 3 which are the same as shown in FIG. 1 will be omitted by retaining the same reference numerals.

As shown in FIG. 3, the amplifier main body portion 10 according to the present variation has a first capacitance adjusting film 25 composed of a high dielectric material such as a strontium titanate (STO) and formed indiscretely over the opposing edge portions of the protruding portions 17a of the pair of internal input matching transmission lines 17. Likewise, a second capacitance adjusting film 26 composed of a high dielectric material is formed indiscretely over the opposing edge portions of the protruding portions 18a of the pair of internal output matching transmission lines 18.

If a capacitor with a larger capacitance is required on the first or second high dielectric substrate 20 or 21, the present variation can thus implement a high-precision capacitor with a larger capacitance by adjusting the thickness of the first or second capacitance adjusting film 25 or 26 or the position at which it is formed.

Although the first and second capacitance adjusting films 25 and 26 have been provided on the internal input matching transmission lines 17 and the internal output matching transmission lines 18, respectively, it is also possible to provide either one of the first and second capacitance adjusting films 25 and 26.

What is claimed is:

1. An RF amplifier comprising:

a pair of power amplifying elements for receiving first and second distributed signals resulting from distribution of an input signal from the outside and having characteristics of the same amplitude and opposite phase, performing power amplification with respect to each of the first and second distributed signals that have been received, and outputting the first and second amplified signals; and a pair of transmission lines provided on a substrate having a ground and connected correspondingly to the pair of power amplifying elements, the pair of transmission lines having a pair of protruding portions provided at respective edge portions thereof disposed in opposing relation, the pair of protruding portions being disposed in mutually spaced apart and opposing relation to compose a capacitor, and a capacitance value of the capacitor is larger than a capacitance value of a capacitor composed of the ground and the pair of transmission lines.

2. An RE amplifier comprising:

a pair of power amplifying elements for receiving first and second distributed signals resulting from distribution of an input signal from the outside and having characteristics of the same amplitude and opposite phase, performing power amplification with respect to each of the first and second distributed signals that have been received, and outputting the first and second amplified signals;

a pair of transmission lines connected correspondingly to the pair of power amplifying elements, the pair of transmission lines having a pair of protruding portions provided at respective edge portions thereof disposed in opposing relation, the pair of protruding portions being disposed in mutually spaced apart and opposing relation to compose a capacitor; and a capacitance adjusting film composed of a high dielectric material and provided indiscreetly over the pair of protruding portions.

3. The RF power amplifier of claim 1, wherein each of the pair of protruding portions has a line length corresponding to about ¹⁄₁₂ of a fundamental wavelength of the input signal.

4. The RF power amplifier of claim 1, wherein the pair of transmission lines are formed on respective substrates each composed of a high dielectric material.

* * * * *

UNITED STATES PATENT AND TRADEMARK OFFICE
CERTIFICATE OF CORRECTION

PATENT NO. : 6,621,347 B2
DATED : September 16, 2003
INVENTOR(S) : Shigeru Morimoto et al.

It is certified that error appears in the above-identified patent and that said Letters Patent is hereby corrected as shown below:

<u>Title page,</u>
Item [75], Inventors", change "Moriguchi (JP)" to -- Osaka (JP) --; and change "Takatsuki (JP)" to -- Osaka (JP) --;

<u>Column 10,</u>
Line 7, change "RE" to -- RF --;

Signed and Sealed this

Sixth Day of April, 2004

JON W. DUDAS
*Acting Director of the United States Patent and Trademark Office*